(12) United States Patent
Sze et al.

(10) Patent No.: US 7,102,454 B2
(45) Date of Patent: Sep. 5, 2006

(54) HIGHLY-LINEAR SIGNAL-MODULATED VOLTAGE CONTROLLED OSCILLATOR

(75) Inventors: Bour-Yi Sze, Taichung (TW); Chih-Long Ho, Taipei (TW); Nean-Chu Cheng, Taipei (TW)

(73) Assignee: VIA Technologies, Inc., Taipei (TW)

( * ) Notice: Subject to any disclaimer, the term of this patent is extended or adjusted under 35 U.S.C. 154(b) by 49 days.

(21) Appl. No.: 11/047,835

(22) Filed: Jan. 31, 2005

(65) Prior Publication Data

US 2006/0028281 A1    Feb. 9, 2006

Related U.S. Application Data

(60) Provisional application No. 60/599,260, filed on Aug. 4, 2004.

(51) Int. Cl.
*H03B 5/08* (2006.01)
*H03B 5/12* (2006.01)
*H03C 3/00* (2006.01)
*H03L 7/099* (2006.01)

(52) U.S. Cl. .................... 331/117 FE; 331/36 C; 331/177 V; 331/179; 332/127; 332/141

(58) Field of Classification Search ................ 331/17, 331/18, 23, 25, 36 C, 117 R, 117 FE, 117 D, 331/177 V, 179; 332/127, 141
See application file for complete search history.

(56) References Cited

U.S. PATENT DOCUMENTS 5,434,543 A * 7/1995 Brilka et al. ............ 331/117 R

* cited by examiner

*Primary Examiner*—David Mis
(74) *Attorney, Agent, or Firm*—Preston Gates & Ellis LLP

(57) ABSTRACT

A VCO system embodying the features of the present invention includes a frequency tuning circuit, a modulation circuit coupled in a parallel fashion with the frequency tuning circuit, a band tuning circuit coupled with the frequency tuning circuit in a parallel fashion having at least one switching circuit, a core circuit coupled with the frequency tuning circuit, the modulation circuit, and the band tuning circuit, wherein upon asserting a switching signal and upon adjusting a frequency turning signal, a frequency tuning bias signal, and a band tuning signal, the switching circuit is enabled for configuring the band tuning circuit to join the frequency tuning circuit for adjusting a predetermined output frequency based on a total inductance and a total capacitance provided by the core circuit, the frequency tuning circuit, the modulation circuit and the band tuning circuit.

24 Claims, 6 Drawing Sheets

HIGHLY-LINEAR SIGNAL-MODULATED VOLTAGE CONTROLLED OSCILLATOR

CROSS REFERENCE

This application claims the benefits of U.S. Provisional Patent Application Ser. No. 60/599,260, filed on Aug. 4, 2004, and entitled "HIGHLY LINEAR SIGNAL MODULATION VOLTAGE-CONTROLLED OSCILLATOR". This application further relates to co-pending applications entitled "SYMMETRICAL LINEAR VOLTAGE CONTROLLED OSCILLATOR" filed on Jan. 31, 2005, under Ser. No. 11/048,456, and "SIGNAL MODULATED VOLTAGE CONTROLLED OSCILLATOR SYSTEM", filed on Jan. 31, 2005, under Ser. No. 11/048,151.

BACKGROUND

The present invention relates generally to semiconductor voltage controlled oscillator (VCO) devices, and more particularly to improved integrated designs of highly linear signal-modulated VCO devices.

The popularity of mobile telephones has placed exceptional attention to wireless architectures and circuit techniques. In addition, the reduction in scaling of complementary metal-oxide semiconductor (CMOS) technologies in recent years has resulted in significant improvements in the radio frequency (RF) performance of MOS devices. As an example of the CMOS RF technology improvements, single-chip transceiver designs have already been demonstrated using low-cost CMOS technology. RF CMOS integrated circuit (IC) technology has advanced to the point of commercial deployment.

One of the key elements of the wireless communications transceivers is voltage controlled oscillators (VCOs). They are part of the frequency synthesizer that generates the local oscillator (LO) signal for both up-conversion and down-conversion of the baseband signal. For monolithic integration into CMOS devices, inductance-capacitance (LC) tank oscillators are preferred over other oscillators due to its better relative phase noise performance and its low power consumption. Despite continuous improvements in VCOs, however, VCO design still remains both a bottleneck and the main challenge for RF transceiver design. These challenges include reducing phase noise, power consumption, and optimizing frequency tuning range. In LC tank VCOs, phase noise and power consumption depend primarily on the quality factor (Q) of the tank and the non-linearities of varactors, which are specially designed P-N junction diodes, whose capacitance change significantly in the reverse bias mode. There are numerous varactor types: PN-junction, standard mode p/nMOS, or accumulation mode p/nMOS varactors. The frequency tuning range is determined by the capacitance tuning range of the varactor and the parasitic characteristics of the VCO. Therefore, the main task is to optimize the performance of the inductors and varactors. The control voltage applied to the VCO changes the capacitance value of the varactor, which determines the oscillation frequency of the VCO. The inductance, L, and the parallel capacitance, C, determine the oscillation frequency, f, of the VCO by the following equation:

$$f = 1/2\pi(LC)^{1/2}$$

Varactors are used to cover a certain frequency band. The active devices of the VCO overcome the losses in the tank. To reduce the phase noise of the VCO, the passive elements of the tank need to have large quality (Q) factors, since the quality factors of the tank quadratically influence the phase noise of the VCO. At frequencies suitable for mobile communications, the quality factors of integrated inductors are usually much lower than the quality factors of conventional diodes or MOS varactors. In these applications, the inductors determine the worst-case phase noise and whether or not the VCO specifications can be met.

The performance of integrated inductors is strongly influenced by losses through undesired currents in the substrate, or by the serial resistance of the inductor windings. In digital CMOS technologies, the thickness of the metal layers is much smaller than in bipolar and bi-CMOS technologies, thus leading to much higher serial resistances. Further the substrates are highly doped, thus leading to large substrate losses. Digital CMOS technologies allow the integration of both digital and analog functions on the same chip without exponentially increasing the cost of digital CMOS technology fabrication.

Moreover, conventional VCOs require a large die size, have low linearity, and have no signal modulation capability. The parasitic effects of the physical layout increase the variability of the set-on oscillator frequency. As such, oscillator frequency cannot be reliably predicted.

Therefore, desirable in the art of VCO designs are improved VCO designs with a smaller footprint, higher linearity, improved set-on oscillator frequency stability and signal modulation capability incorporated thereto.

SUMMARY

In view of the foregoing, an improved voltage controlled oscillator system is disclosed to improve oscillator reliability, efficiency and controllability.

A VCO system embodying the features of the present invention includes a frequency tuning circuit for receiving a frequency turning signal and a frequency tuning bias signal, a modulation circuit coupled in a parallel fashion with the frequency tuning circuit, a band tuning circuit coupled with the frequency tuning circuit in a parallel fashion having at least one switching circuit for receiving at least one band tuning signal and at least one switching signal, a core circuit coupled with the frequency tuning circuit, the modulation circuit, and the band tuning circuit for providing a first output and a second output that are complementary to each other, wherein the core circuit has at least one inductance module for providing a predetermined inductance, wherein upon asserting the switching signal, the switching circuit is enabled for configuring the band tuning circuit to join the frequency tuning circuit for determining a predetermined output frequency based on a total inductance and a total capacitance provided by the core circuit, the frequency tuning circuit, the modulation circuit and the band tuning circuit upon adjusting the frequency turning signal, the frequency tuning bias signal, and the band tuning signal, and wherein all elements of the voltage controlled oscillator system are arranged in a substantially symmetrical fashion.

The construction and method of operation of the invention, however, together with additional objects and advantages thereof will be best understood from the following description of specific embodiments when read in connection with the accompanying drawings.

DESCRIPTION

The following will provide a detailed description of LC tank VCO circuits that improve VCO circuit performance.

Figure 1:
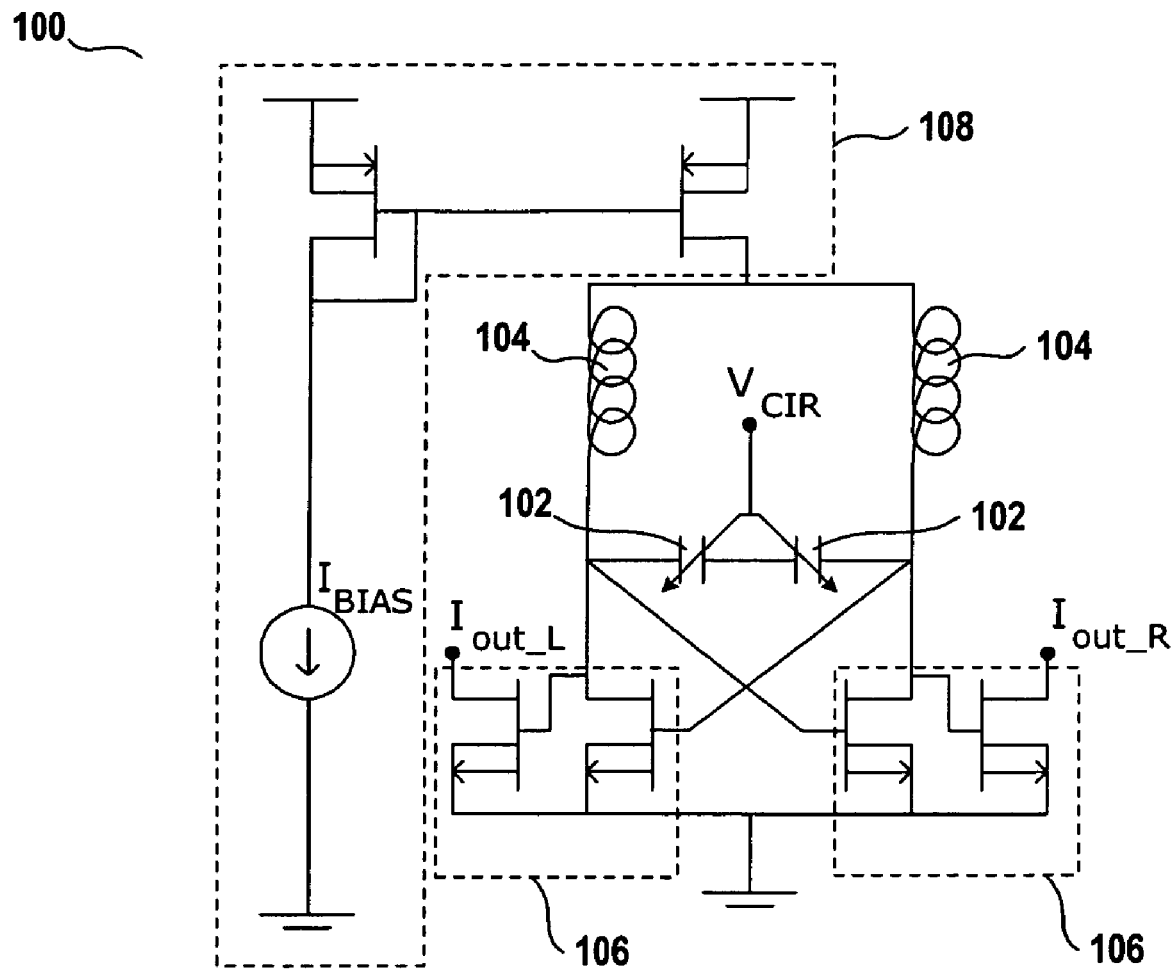
FIG. 1 presents a conventional LC tank VCO circuit.

FIG. 1 presents a conventional LC tank VCO circuit 100. The circuit 100 comprises two varactors 102, two inductors 104, two NMOS cross-coupled MOSFET structures 106, and a constant current power source 108. The NMOS cross-coupled MOSFET structures 106 provide the necessary negative resistance to cancel the loss of the resonator. According to the Barkhaussen rule, oscillations occur when the loop gain is larger than one and when the image portion of the impedance is zero. The VCO oscillation frequency is determined by the equation:

$$f = 1/2\pi(LC)^{1/2}$$

where L is the total inductance of the two inductors 104, and C is the network capacitance comprising the capacitance of the two varactors 102 and a circuit parasitic capacitance.

Since this design does not utilize a symmetrical topology, the parasitic capacitances could be quite large and indeterminable. Thus, the VCO output frequency can not be predicted with any accuracy with a large parasitic capacitance of the circuit 100. It is noted that the circuit 100 does not have a built-in modulation capability, and therefore requires an external modulation circuit. The circuit 100 also has low linearity, thereby producing additional flicker noise in the output. Due to the asymmetrical topology of this design, even-mode harmonics are not suppressed. Because of the above factors, the loaded quality factor of the total LC tank circuit cannot be predicted reliably and accurately.

Figure 2:
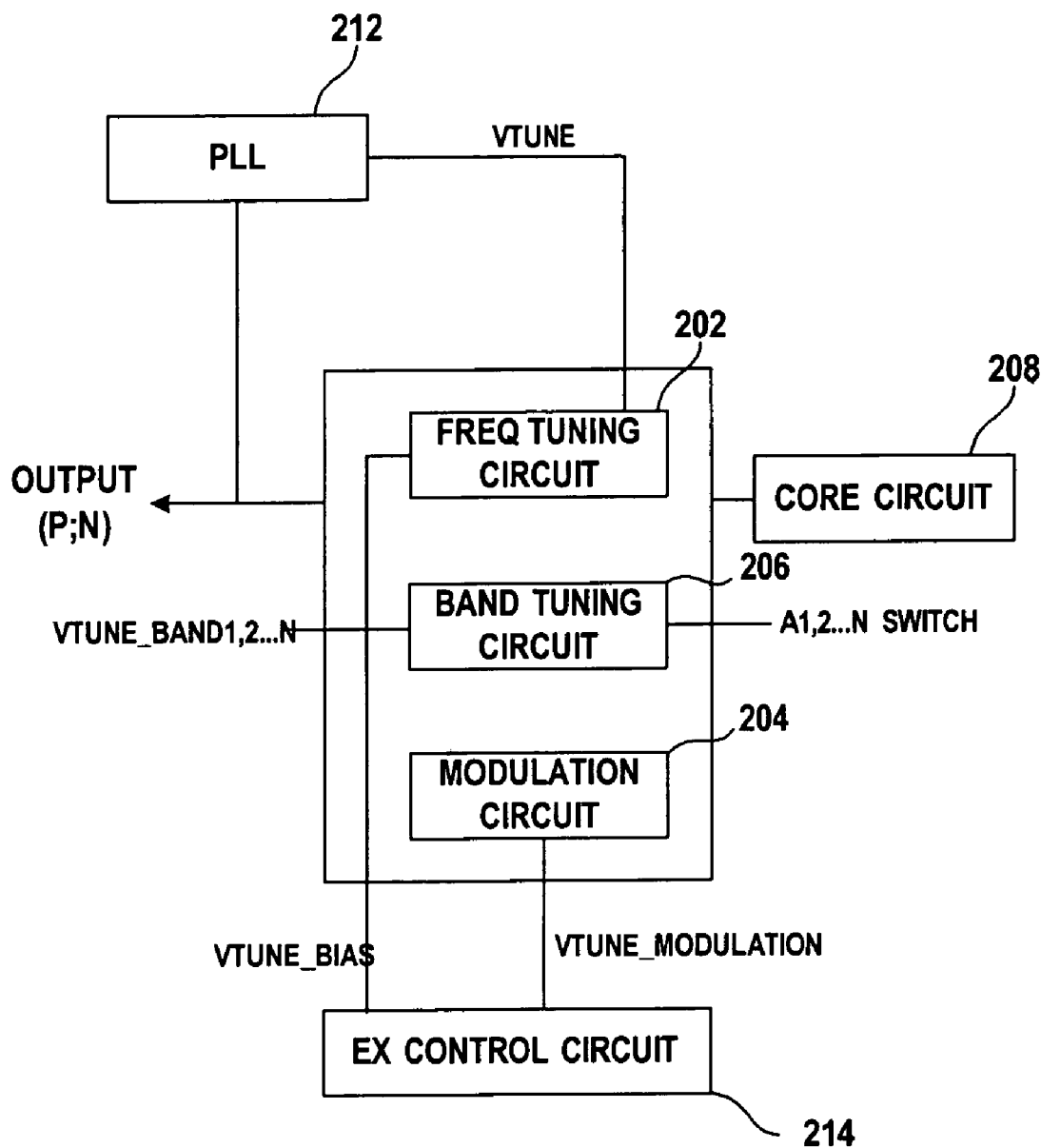
FIG. 2 presents a block diagram of a symmetrical LC tank VCO system in accordance with one embodiment of the present invention.

FIG. 2 presents a block diagram of a high-linearity, signal-modulated symmetrical LC tank VCO system 200 in accordance with one embodiment of the present invention. The VCO system 200 comprises a frequency tuning circuit 202, a modulation circuit 204, a band tuning circuit 206, a core circuit 208, and generates one or more VCO outputs such as the complimentary OUTPUT_P and OUTPUT_N at a particular output frequency. The combination of the frequency tuning circuit 202, the band tuning circuit 206, and to certain extent, the modulation circuit 204 collectively control the output frequency. Conceptually, the frequency tuning circuit 202 provides a first layer of frequency tuning, based on which, the band tuning circuit 204 further provides another layer of frequency tuning, which together determine the output frequency and phase generated by the VCO system 200.

In order to stabilize the output frequency and its phase, an optional phase-locked feedback mechanism may be deployed using a frequency tuning signal such as a VTUNE feedback signal, which provides a feedback voltage in this embodiment. The level of this feedback voltage is dependent upon the type of varactors in the frequency tuning circuit 202. Typical types include PN-junction, standard mode p/nMOS, or accumulation mode p/nMOS. A phase-lock loop (PLL) module 212, such as a PLL frequency synthesizer, provides the VTUNE signal based on the output of the VCO circuit. The PLL module 212 provides precise VCO output frequency control as well as phase control by varying the voltage that changes the varactor's capacitance.

There may be another external control circuit 214 for generating tuning and modulation related control signals such as a frequency tuning bias signal VTUNE_BIAS and a modulation signal VTUNE_MODULATION. This external control circuit can be an external analog source circuit such as an analog baseband (ABB) circuit. For example, in the band tuning circuit 206, one or more frequency bands can be selected/enabled by receiving one or more switching signals ("A1 SWITCH", "A2 SWITCH" . . . "AN SWITCH") to enable certain circuitries. The frequency tuning bias signal VTUNE_BIAS, the band tuning signal VTUNE_BAND, and the switching signals together fine tune the frequency. Depending upon the design, the VCO system may contain just one or multiple frequency bands.

The modulation signal VTUNE_MODULATION providing a modulation voltage from the external control circuit helps to modulate the VCO outputs. The VTUNE_MODULATION signal varies the voltage applied to the modulation varactors. Any modulation type may be utilized to modulate the VCO output frequency such as amplitude modulation, frequency modulation, and frequency shift keying, etc.

It is understood that the frequency tuning circuit 202, the band tuning circuit 206, and the modulation circuit 204 may all contain varactors. The varactors may be made of the same type, or can also be made of different types. Such varactor types include: PN-junction, standard mode p/nMOS, or accumulation mode p/nMOS.

Figure 3:
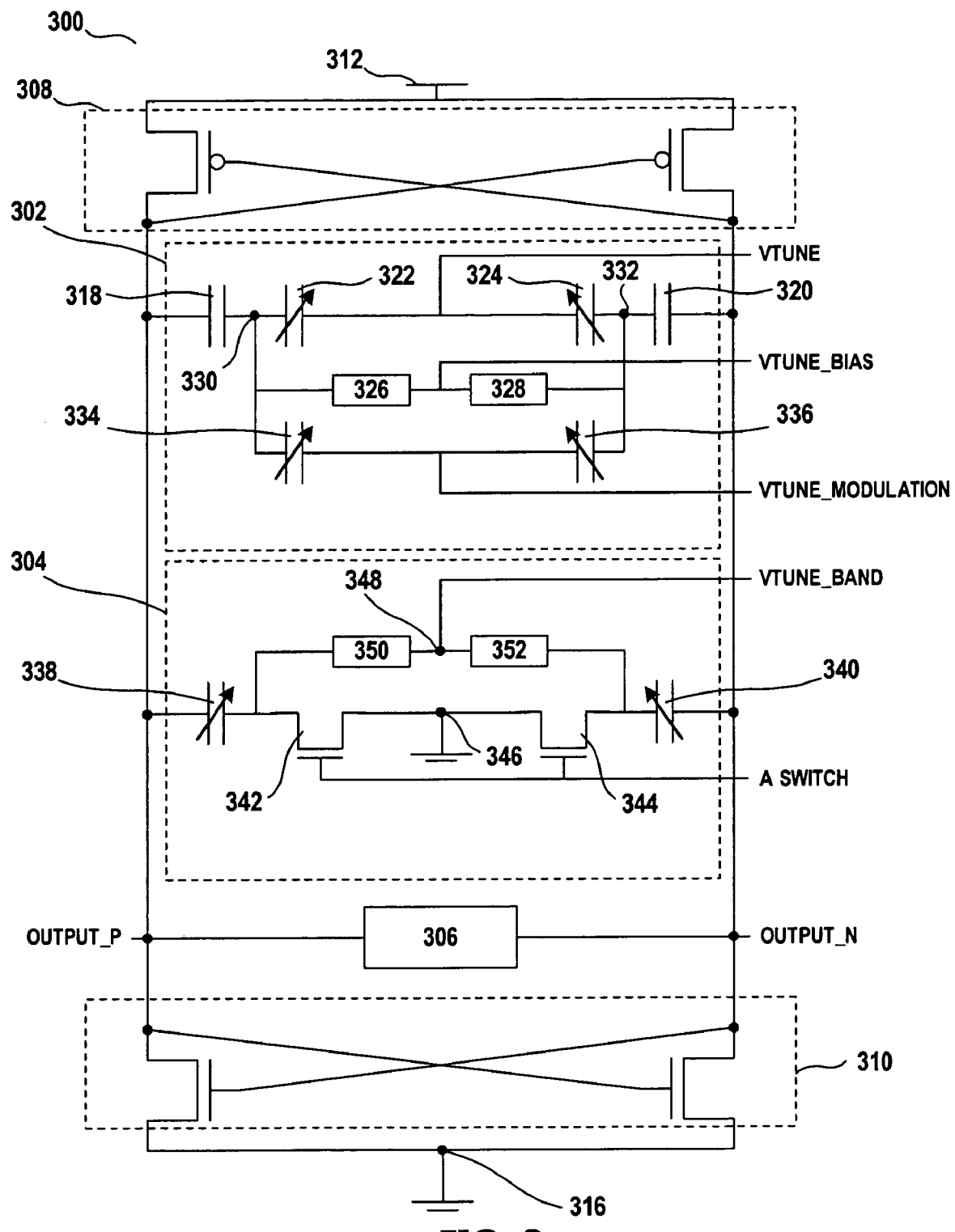
FIG. 3 presents an integrated, symmetrical LC tank VCO circuit in accordance with one embodiment of the present invention.

FIG. 3 presents an integrated, symmetrical LC tank VCO circuit 300 in accordance with one embodiment of the present invention. The circuit 300 includes a frequency tuning circuit 302 integrated with a modulation circuit, a band tuning circuit 304 having at least one switching circuit, an inductance module 306, and a core circuit having a PMOS cross-coupled transistor structure 308, a NMOS cross-coupled transistor structure 310. The circuit 300 provides two complementary outputs OUTPUT_P and OUTPUT_N. It is further understood that the circuit 300 can be fabricated on a semiconductor substrate using standard CMOS fabrication processes. The circuit 300 fabricated on a CMOS substrate results in a smaller footprint and hence lower fabrication costs than conventional VCO designs.

In this example, through the core circuit, the circuit 300 receives power from a first power source 312 such as VCC, and is tied to a second power source such as an electrical ground or VSS at a node 316. The topology of the circuit 300 has an excellent symmetry in that the circuit elements of the transistor structures 308 and 310, the frequency tuning circuit 302, the band tuning circuit 304, and the inductor 306 are arranged in a substantially symmetrical manner. Comparing with conventional VCO designs, these symmetrical VCO designs reduce the even-mode VCO harmonics and any flicker noise to be up converted and reduce the circuit parasitics in the VCO outputs. Further, the continuous output provides a better signal quality and reduces signal distortion and noise generation that is common in conventional VCO designs.

It is understood that the frequency tuning circuit 302 is "integrated" in that it provides both phase lock and modulation capabilities to the circuit 300 although it is understood that the modulation feature can be provided by a separate circuit coupled in parallel with the frequency tuning circuit 302. In this embodiment, the feedback frequency tuning signal VTUNE adjusts the VCO output frequency and phase.

The integrated frequency tuning circuit includes at least a capacitor 318 connected in series with a varactor 322 via a node 330, and a capacitor 320 connected in series with a varactor 324 via a node 332. The serial connections increase the linearity of the integrated frequency tuning circuit 302. The capacitors 318 and 320 are also respectively in series with resistors 326 and 328. The resistor 326 and the capacitor 318, as the resistor 328 and the capacitor 320, can be seen as a differential low-pass filter that is used to eliminate external noise. The VTUNE_BIAS signal has a predetermined voltage, which may be supplied by an external control circuit, not shown. This voltage signal is received by the frequency tuning circuit 302 at a point between the resistors 326 and 328, thereby affecting the voltages at the nodes 330 and 332 for controlling varactors 322, 332, 334, and 336. The predetermined voltage level asserted by VTUNE_BIAS is dependent upon the type of varactors in the frequency tuning circuit 302.

The modulation portion of the integrated frequency tuning circuit 302 includes at least the varactor 334, whose one end connects to the node 330 and whose other end receives the modulation signal VTUNE_MODULATION. Similarly, the varactor 336 has its one end connecting to the node 332 and whose other end also receives the VTUNE_MODULATION signal. As illustrated in FIG. 2, the VTUNE_MODULATION signal may be provided by an external control circuit such as an ABB circuit. It is understood that the VCO output frequency can be modulated using amplitude modulation, frequency modulation, frequency shift keying, or other modulation types. As shown, with the symmetrical structure of this integrated frequency tuning circuit, through the three control signals VTUNE, VTUNE_BIAS, and VTUNE_MODULATION, the voltages across all the varactors can be adjusted for frequency adjustment, phase locking, and output modulation.

As shown, separately from the integrated frequency tuning circuit, the band tuning circuit 304 provides another layer of frequency tuning capability by introducing additional capacitance into the VCO circuit through capacitance modules such as varactors 338 and 340 so that the VCO output frequency can be further altered by varying the total capacitance. The capacitance modules 338 and 340 can also be capacitors with fixed capacitance. The band tuning circuit can be enabled by a "A SWITCH" signal that activates switching modules 342 and 344 to electrically connect the varactors 338 and 340 together. As shown, the switching modules 342 and 344 are NMOS transistors, but they can also be PMOS transistors. It is understood that the "A SWITCH" signal may be generated by external circuits, which can be set to control the desired frequency of the circuit 300. It is noted that the sources of the switching modules 342 and 344 are tied to ground at a node 346. Even if they are not physically tied to ground, it is a virtual AC ground as it is in the middle of the circuit 300, thereby reducing the series resistance and further increasing the quality factor of the circuit 300.

The band tuning signal "VTUNE_BAND" also has a predetermined voltage provided by an external circuit. This band tuning signal supplies a predetermined voltage to a node 348 between tuning resistors 350 and 352, whose other ends are applied to the drains of the switching modules 342 and 344, respectively. This band tuning signal provides voltage to the varactors 338 and 340 via the tuning resistors 350 and 352, respectively, to vary the capacitance of the varactors and hence the VCO output frequency of the outputs OUTPUT_P and OUTPUT_N. The arrangement of the tuning resistor 350 and the capacitance of the varactor 338, as the arrangement of the tuning resistor 352 and the capacitance of the varactor 340, can be seen as a differential low-pass filter that is used to reduce or eliminate external noise.

The transistor structures 308 and 310 provide necessary negative resistance to increase power for compensating the losses of the LC resonator tank (which includes the inductor and the capacitance providing frequency tuning circuit and the band tuning circuit) that is parallel thereto. Also, a proper choice of the electrical characteristics of these cross-coupled transistor structures 308 and 310 significantly reduces the up-conversion of flicker noise.

The integration of the varactors with the inductor 306 in a symmetrical fashion to form the VCO LC tank is important to the performance of the circuit 300. A proper symmetrical design of these components will reduce the circuit parasitic capacitance, and improve the oscillation efficiency. As seen, the capacitors 318 and 320 are in series with the varactors 322 and 324 and further with the varactors 334 and 336. This serial connectivity increases varactor linearity. A second advantage is the excellent symmetry of the frequency tuning circuit 302, the tuning circuit 304, the transistor structures 308 and 310, and the inductor 306. The symmetry of the design reduces the even-mode VCO harmonics and also reduces the flicker noise in the VCO outputs, when compared to conventional VCO designs. A third advantage of the frequency tuning circuit 302 is the built-in signal modulation and feedback phase lock functions. The built-in modulation function eliminates the need for an external signal modulator, thereby reducing chip size (35 to 45% size reduction) and fabrication costs. The continuous output provides a better signal quality and reduces the signal distortion and noise generation that is typical in conventional VCO designs. Also, built-in low-pass filters in the frequency tuning circuit 302 and the tuning circuit 304 eliminate external noise without additional components. Finally, the "integrated" design eliminates some circuit components, more closely integrates the functionality while permitting a smaller footprint. After the integration, circuit parasitics can be easily compensated for, thus allowing for easy and precise calculation of the overall loaded quality factor of the circuit 300.

It is understood by one skilled in the art that the relationship of the output frequency and the capacitance and inductance of the VCO circuit can be mathematically represented as:

$$f \propto 1/(L(C1+C2))^{1/2}$$

wherein C1 is the total capacitance of the frequency tuning circuit 302 and C2 is the total capacitance of the band tuning circuit 304, and L represents the inductance provided largely by the inductance device 306. As shown, the frequency tuning is collectively controlled by the alteration of C1 and C2 assuming L is largely unchanged. Also, C1 is contributed by the varactor 318, 320, 334, and 336, which can be the same or different varactors as the design may be. Similarly, C2 is contributed by the varactor 338 and 340, which again can be the same or different so that the frequency tuning can be done in various ways. For example, the varactors 318 and 320, and 334 and 336 can be set to provide a total capacitance of a predetermined value, and the varactors 338 and 340 can be adjusted to be at one quarter, one half, three fourth of that predetermined capacitance to tune the frequency.

Figure 4:
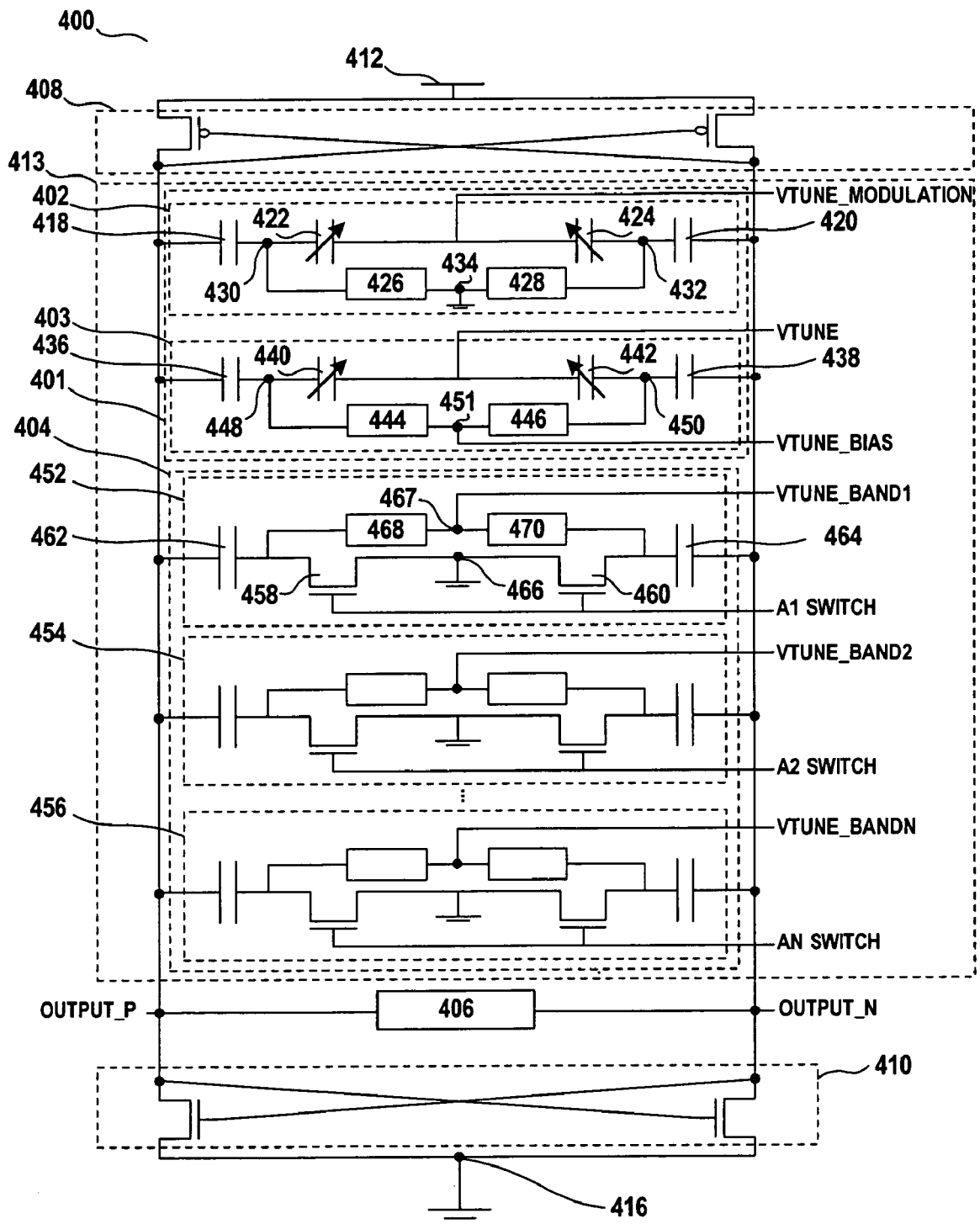
FIG. 4 presents a separated, symmetrical LC tank VCO circuit in accordance with one embodiment of the present invention.

FIG. 4 presents a separated, symmetrical LC tank VCO circuit 400 in accordance with another embodiment of the present invention. As will be evident, the circuit 400 has a multiple digital tuning band structure. The circuit 400 includes a frequency tuning circuit 401 having a separate modulation circuit 402 and a frequency tuning module 403, which are connected in a parallel fashion, a band tuning circuit 404 having multiple switching circuits, an inductance module 406, a core circuit with a PMOS cross-coupled transistor structure 408 and a NMOS cross-coupled transistor structure 410. The VCO circuit produces outputs OUTPUT_P and OUTPUT_N. The circuit 400 receives its power from a first power source 412 such as VCC, and is tied to another such as an electrical ground or VSS 416. The circuit 400 is fabricated into the CMOS substrate, thereby resulting in a smaller footprint and hence lower fabrication costs than conventional VCO designs. The topology of the circuit 400 has excellent symmetry in that the circuit designs of the transistor structures 408 and 410, the frequency tuning circuit 401, the band tuning circuit 404, and the inductor 406 are substantially symmetrical.

Comparing with the circuit presented in FIG. 3, the frequency tuning circuit 401 is a "separated" design in that the modulation circuit 402 and the frequency tuning module 403 are two isolated circuits, which are coupled in a parallel fashion as they all connect to the two outputs. This separation can allow for implementation of just one or both of the circuits to meet a specific design specification with minimum circuitry, hence potentially requiring a smaller footprint.

The modulation circuit 402 includes capacitors 418 and 420 that are connected respectively in series with varactors 422 and 424 via nodes 430 and 432. The varactors 422 and 424 may be P/N junction varactors. The capacitors 418 and 420 are connected respectively in series with resistors 426 and 428 via the nodes 430 and 432. In this embodiment, the resistors 426 and 428 are further connected to ground via a node 434, but even if they are not coupled to ground, they will be considered to be coupled to a virtual AC ground as the node 434 is located in the middle of the circuit 400. This arrangement reduces series resistance and improves quality factor of the circuit 400. The resistor 426 and the capacitor 418 pair, as the resistor 428 and the capacitor 420 pair, can be seen as a differential low-pass filter that is used to eliminate external noise.

One or more outputs of the circuit 400 are modulated by the VTUNE_MODULATION signal applied to the varactors 422 and varactor 424. It is understood that this signal may be generated by an external control circuit. It is further understood that the VCO output frequency can be modulated using amplitude modulation, frequency modulation, frequency shift keying, or other modulation types.

The frequency tuning circuit uses the frequency turning signal VTUNE to adjust the VCO output frequency and phase. For example, the frequency turning signal VTUNE can be generated from a feedback mechanism such as a PLL module so that the output frequency and phase are locked. In the circuit 403, capacitors 436 and 438 are respectively connected in series with varactors 440 and 442 via nodes 448 and 450. This serial connectivity increases the circuit's overall linearity. As shown, the capacitors 436 and 438 are also respectively connected in series with resistors 444 and 446 via the nodes 448 and 450. The resistor 444 and the capacitor 436, as the resistor 446 and the capacitor 438, can be seen as a differential low-pass filter that is used to reduce or eliminate external noise. A frequency tuning bias signal VTUNE_BIAS also provides a predetermined voltage at a node 451, which is midway between the resistors 444 and 446. It is understood that the level of this predetermined voltage may be dependent upon the type of varactors in the frequency tuning circuit 402.

In addition to the frequency tuning circuit, the band tuning circuit 404 incorporates a digital tuning structure with multiple tuning bands to provide the capability to tune the VCO output frequency by switching in specific sets of capacitors, thereby changing the total capacitance value of the circuit 400. As shown, the band tuning circuit 404 has capacitive switching circuits 452, 454, and 456. A "Ax SWITCH" signal (where x=1, 2, ... n) enables one of the capacitive switching circuits by, for example, applying a switching voltage to switches therein. These signals can be generated by an external circuit for providing multiple parallel bits that can control a plurality of these capacitive switching circuits, thereby at any one time generating the desired VCO output frequency. For example, in the capacitive switching circuit 452, the "A1 SWITCH" signal supplies a voltage to the gate of switching modules 458 and 460 to switch in capacitors 462 and 464 to contribute to the final generation of the VCO output. The capacitors 462 and 464, to be seen as capacitance modules providing a capacitance source to the capacitive switching circuit 452, are respectively in series with tuning resistors 468 and 470. The tuning resistor 468 and the capacitor 462, as with the tuning resistor 470 and the capacitor 464, can be seen as a differential low-pass filter that is used to eliminate external noise. It is noted that the switching modules are NMOS transistors in this embodiment, whose gates receive the "A1 SWITCH" signal, and that the sources of the switching modules 458 and 460 are tied to ground at a node 466. Even if the node 466 is not tied to ground, they are considered to be at a virtual AC ground given the symmetrical design of the circuit. By positioning this ground or virtual ground in the middle of the circuit 400, series resistance of the circuit is reduced, while the quality factor of the circuit may be improved. The band tuning signal "VTUNE_BAND1" provides a predetermined voltage to a node 467, which is at a midpoint between tuning resistors 468 and 470, which are further respectively connected in series with the capacitors 462 and 464. The "VTUNE_BAND1" signal provides a bias to the drains of the switching modules 458 and 460. It is understood that the capacitive switching circuits 454 and 456 function in a similar fashion as the capacitive switching circuit 452, except that they receive the "A2 SWITCH" to "AN SWITCH" signals, as well as the "VTUNE_BAND2" and "VTUNE_BANDN" signals for controlling the operation thereof. Although this embodiment presents three capacitive switching circuits, any number of capacitive switching circuits may be added or removed to meet specific system requirements.

One advantage of the circuit 400 is its excellent linearity. The linearity between the capacitors 418 and 420 and the varactors 422 and 424, as well as the linearity between the capacitors 436 and 438 and the varactors 440 and 442, increase the overall linearity. A second advantage is the circuit 400's excellent symmetry. In the circuit 400, the transistor structures 408 and 410, the inductor 406, the frequency tuning circuit 401, and the tuning circuit 404 are substantially symmetrical by design. The symmetrical design of the circuit 400 significantly reduces the parasitic capacitances within the circuit, thereby providing VCO output frequency stability and set-on accuracy during the design stage. A third advantage of the circuit 400 is the built-in signal modulation and phase-lock loop functions. Fourth, the built-in differential low-pass filter eliminates external noise without additional components. Finally, the circuit 400, which provides a "separated" design, allows for a reduced chip size if either the modulation or the phase-lock loop functions is not required in a particular system design.

Figure 5A:
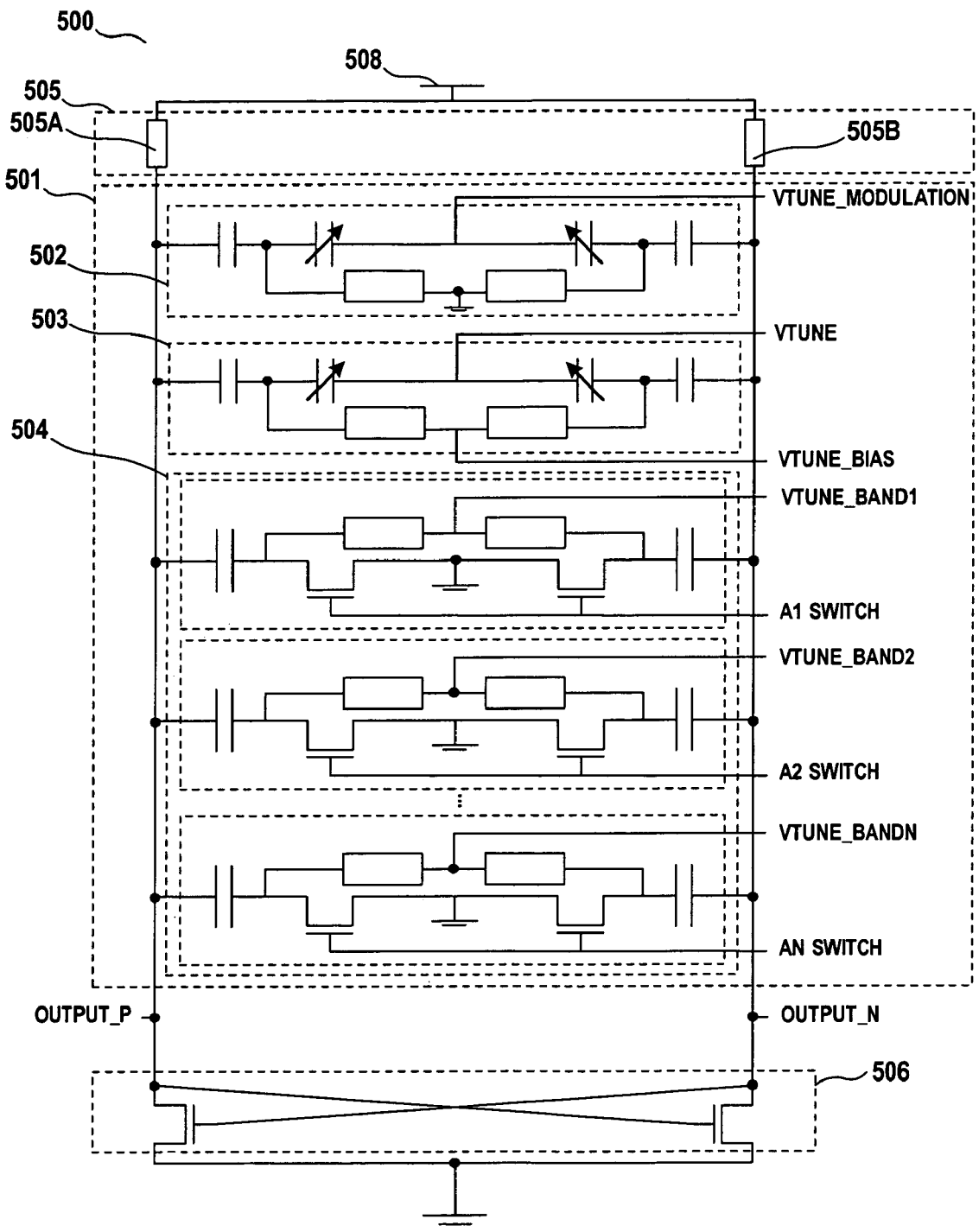
FIG. 5 presents another separated, symmetrical LC tank VCO circuit in accordance with one embodiment of the present invention.
Figure 5B:
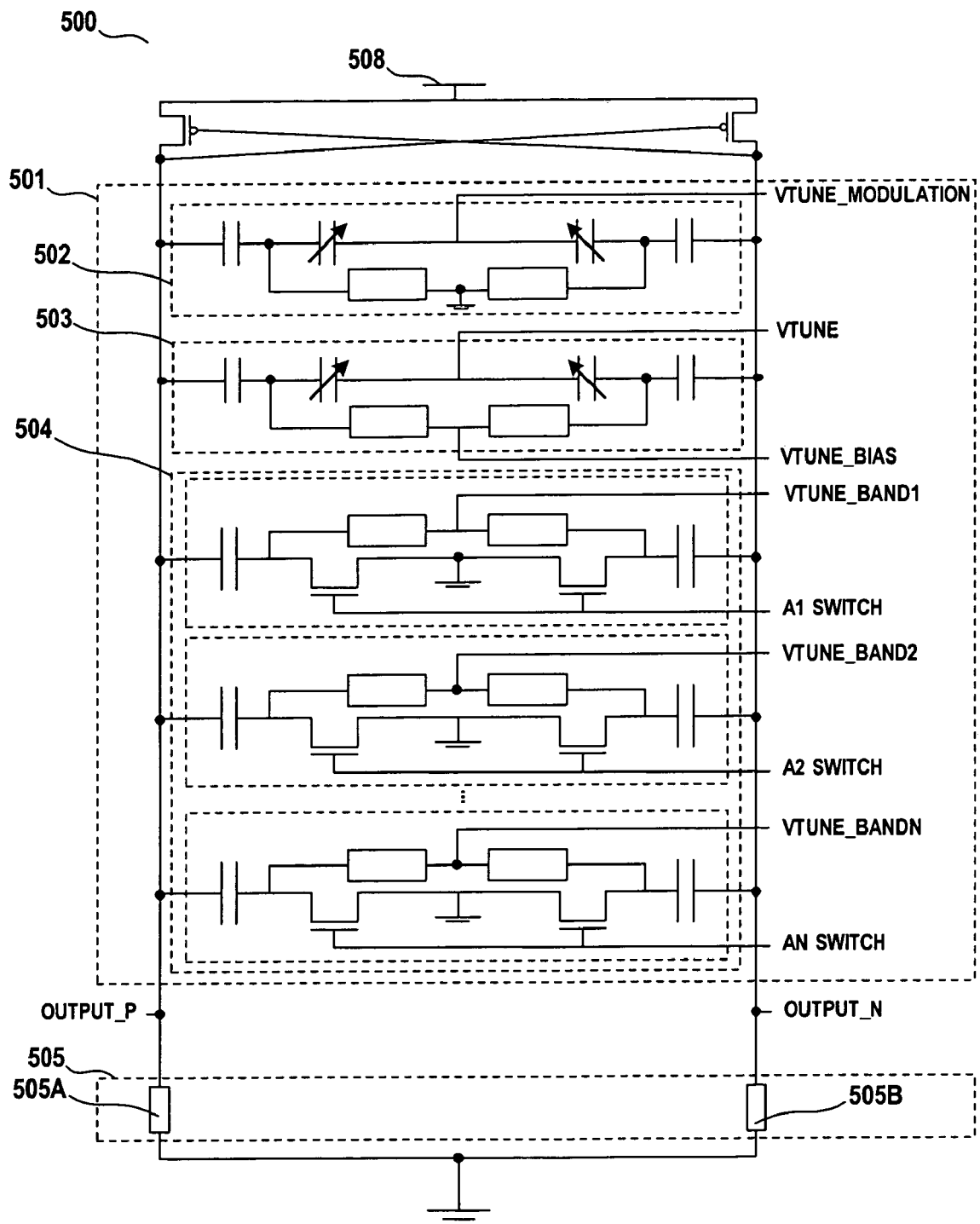

FIGS. 5A and 5B present another separated, symmetrical LC tank VCO circuit 500 in accordance with other embodiments of the present invention. The circuit 500 incorporates a digital tuning structure with multiple tuning bands that is similar to that of the circuit 400. In this example, the VCO circuit largely comprises a frequency tuning circuit 501 having a modulation circuit 502 and a tuning module 503, and a band tuning circuit 504 further having multiple capacitive switching circuits. However, the inductor 406 of the circuit 400 has been eliminated, and replaced by an inductor module 505 having inductors 505A and 505B, which are respectively coupled at one end to the VCO outputs OUTPUT_P and OUTPUT_N. The other ends of the inductors 505A and 505B are coupled to a power source 508. The PMOS cross-coupled transistor structure 408 is eliminated, while the NMOS cross-coupled transistor structure 410 reappears as a NMOS cross-coupled transistor structure 506. It is understood that the circuit 500 exhibits the same performance characteristics and advantages as the circuit 400. Similarly in FIG. 5B, the PMOS cross-coupled transistor structure stays unchanged while the NMOS cross-coupled transistor structure is replaced by the inductor module 505.

The above described embodiments utilize a complementary cross-coupled topology with a symmetrical design. Compared with conventional designs that use asymmetrical inductors, these embodiments can improve output voltage swing and phase noise significantly (e.g., by 65% and 2.3 db respectively) for a given power consumption. At the same time, the required chip area is reduced by 36% compared to conventional inductor designs.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A voltage controlled oscillator system comprising:
   a frequency tuning circuit for receiving a frequency turning signal and a frequency tuning bias signal;
   a modulation circuit coupled in a parallel fashion with the frequency tuning circuit;
   at least one band tuning circuits coupled with the frequency tuning circuit in a parallel fashion having at least one switching circuit for receiving at least one band tuning signal and at least one switching signal; and
   a core circuit coupled with the frequency tuning circuit, the modulation circuit, and the band tuning circuit for providing a first output and a second output that are complementary to each other,
   wherein the core circuit has at least one inductance module for providing a predetermined inductance,
   wherein upon asserting the switching signal, the switching circuit is enabled for configuring the band tuning circuit to join the frequency tuning circuit for determining a predetermined output frequency based on a total inductance and a total capacitance provided by the core circuit, the frequency tuning circuit, the modulation circuit and the band tuning circuit upon adjusting the frequency tuning signal, the frequency tuning bias signal, and the band tuning signal, and
   wherein all elements of the voltage controlled oscillator system are arranged in a substantially symmetrical fashion.

2. The system of claim 1, wherein the frequency tuning circuit is integrated with the modulation circuit.

3. The system of claim 2, wherein the integrated frequency turning and modulation circuits further include:
   a first capacitor and a second capacitor coupled to the first and the second outputs on their first ends respectively;
   a first group of varactors having a first varactor and a second varactor coupled in series with and between the first and second capacitors with a mid point between the first and second varactors coupled to the frequency turning signal;
   a resistor group having a first resistor and a second resistor coupled in series with and between the first and second capacitors with a mid point between the first and second resistors coupled to the frequency tuning bias signal; and
   a second group of varactors having a third varactor and a fourth varactor coupled in series with and between the first and second capacitors with a mid point between the third and fourth varactors coupled to the modulation signal,
   wherein the first and second varactor groups and the resistor group are coupled in a parallel fashion and together coupled in series with the first and second capacitors between their second ends.

4. The system of claim 1, further comprising:
   a phase-locked loop frequency synthesizer for providing the frequency tuning signal based on at least one of the outputs; and
   a control circuit coupled with the modulation circuit for providing the modulation signal and the frequency tuning bias signal.

5. The system of claim 1, wherein the frequency tuning circuit has the modulation circuit separated from a frequency tuning module, which are coupled in a parallel fashion.

6. The system of claim 5, wherein the frequency tuning module further includes:
   a first capacitor and a second capacitor coupled to the first and the second outputs on their first ends respectively;
   a first varactor and a second varactor coupled in series with and between the first and second capacitors with a mid point between the first and second varactors coupled to the frequency turning signal; and
   a first resistor and a second resistor coupled in series with and between the first and second capacitors with a mid point between the first and second resistors coupled to the frequency tuning bias signal,
   wherein the first and second resistors are coupled in a parallel fashion with the first and second varactors and together coupled to the first and second capacitors in series between their second ends.

7. The system of claim 5, wherein the modulation circuit further includes:
a first capacitor and a second capacitor coupled in series and to the first and the second outputs on their first ends respectively;
a first varactor and a second varactor coupled in series with and between the first and second capacitors with a mid point between the first and second varactors coupled to the modulation signal; and
a first resistor and a second resistor coupled in series with and between the first and second capacitors with a mid point between the first and second resistors coupled to an electrical ground,
wherein the first and second resistors are coupled in a parallel fashion with the first and second varactors and together coupled to the first and second capacitors in series between their second ends.

8. The system of claim 1, wherein the band tuning circuit further includes:
a first and a second capacitance modules having a first and second predetermined capacitances coupled to the first and second outputs on their first ends,
a first and second resistors coupled in series and further coupled serially between second ends of the first and second capacitance modules with a mid point between the two resistors controlled by the band tuning signal; and
a first and a second switches coupled in series and further coupled serially between second ends of the first and second capacitance modules with a mid point between the two switches coupled to an electrical ground,
wherein when the switching signal is applied to gates of the switches, the first and second capacitance modules are coupled in a serial fashion.

9. The system of claim 8, wherein the capacitance modules are varactors.

10. The system of claim 1 further comprising a core circuit coupled with both the frequency tuning circuit and the band tuning circuit in a parallel fashion for providing an oscillation mechanism.

11. The system of claim 10, wherein the core circuit further includes:
at least one PMOS cross-coupled transistor structure having at least a pair of cross-coupled PMOS transistors with sources thereof coupled to a power source; and
at least one NMOS cross-coupled transistor structure having at least a pair of cross-coupled NMOS transistors with sources thereof coupled to an electrical ground,
wherein drains of the PMOS and NMOS transistors are coupled to either the first or second outputs, and
wherein a gate of a PMOS or NMOS transistor is cross-coupled to a drain of another PMOS or NMOS transistor of the corresponding pair.

12. The system of claim 10 wherein the core circuit further includes:
at least one NMOS cross-coupled transistor structure having at least a first and second cross-coupled NMOS transistors with sources thereof coupled to an electrical ground, and drains thereof coupled to the first and second outputs;
a first inductance module coupled between a power source and the first output;
a second inductance module coupled between the power source and the second output,
wherein gates of the first and second NMOS transistor are cross-coupled to drains of the second and first NMOS transistor respectively.

13. The system of claim 10 wherein the core circuit further includes:
at least one PMOS cross-coupled transistor structure having at least a first and second cross-coupled PMOS transistors with sources thereof coupled to an power source, and drains thereof coupled to the first and second outputs;
a first inductance module coupled between a ground and the first output;
a second inductance module coupled between the ground and the second output,
wherein gates of the first and second PMOS transistors are cross-coupled to drains of the second and first NMOS transistors respectively.

14. The system of claim 1 further comprising a core circuit coupled with both the frequency tuning circuit and the band tuning circuit in a parallel fashion for providing an oscillation mechanism, the core circuit having at least one cross-coupled transistor structure for providing a negative resistance and at least one inductance module symmetrically positioned.

15. A voltage controlled oscillator system comprising:
a frequency tuning circuit for receiving a frequency turning signal and a frequency tuning bias signal;
a modulation circuit coupled in a parallel fashion with the frequency tuning circuit;
at least one band tuning circuits coupled with the frequency tuning circuit in a parallel fashion having at least one switching circuit for receiving at least one band tuning signal and at least one switching signal;
a phase-locked loop frequency synthesizer for providing the frequency tuning signal based on at least one of the outputs;
a control circuit coupled with the modulation circuit for providing the modulation signal and the frequency tuning bias signal; and
a core circuit coupled with the frequency tuning circuit, the modulation circuit, and the band tuning circuit for providing a first output and a second output that are complementary to each other,
wherein the core circuit has at least one inductance module for providing a predetermined inductance,
wherein upon asserting the switching signal, the switching circuit is enabled for configuring the band tuning circuit to join the frequency tuning circuit for determining a predetermined output frequency based on a total inductance and a total capacitance provided by the core circuit, the frequency tuning circuit, the modulation circuit and the band tuning circuit upon adjusting the frequency tuning signal, the frequency tuning bias signal, and the band tuning signal, and
wherein all elements of the voltage controlled oscillator system are arranged in a substantially symmetrical fashion.

16. The system of claim 15, wherein the frequency tuning circuit is integrated with the modulation circuit to further include:
a first capacitor and a second capacitor coupled to the first and the second outputs on their first ends respectively;
a first group of varactors having a first varactor and a second varactor coupled in series with and between the first and second capacitors with a mid point between the first and second varactors coupled to the frequency turning signal;

a resistor group having a first resistor and a second resistor coupled in series with and between the first and second capacitors with a mid point between the first and second resistors coupled to the frequency tuning bias signal; and a second group of varactors having a third varactor and a fourth varactor coupled in series with and between the first and second capacitors with a mid point between the third and fourth varactors coupled to the modulation signal, wherein the first and second varactor groups and the resistor group are coupled in a parallel fashion and together coupled in series with the first and second capacitors between their second ends.

17. The system of claim 15, wherein the frequency tuning circuit has the modulation circuit separated from a frequency tuning module, which are coupled in a parallel fashion.

18. The system of claim 17, wherein the frequency tuning module further includes:
a first capacitor and a second capacitor coupled to the first and the second outputs on their first ends respectively;
a first varactor and a second varactor coupled in series with and between the first and second capacitors with a mid point between the first and second varactors coupled to the frequency turning signal; and
a first resistor and a second resistor coupled in series with and between the first and second capacitors with a mid point between the first and second resistors coupled to the frequency tuning bias signal,
wherein the first and second resistors are coupled in a parallel fashion with the first and second varactors and together coupled to the first and second capacitors in series between their second ends.

19. The system of claim 17, wherein the modulation circuit further includes:
a first capacitor and a second capacitor coupled in series and to the first and the second outputs on their first ends respectively;
a first varactor and a second varactor coupled in series with and between the first and second capacitors with a mid point between the first and second varactors coupled to the modulation signal; and
a first resistor and a second resistor coupled in series with and between the first and second capacitors with a mid point between the first and second resistors coupled to an electrical ground,
wherein the first and second resistors are coupled in a parallel fashion with the first and second varactors and together coupled to the first and second capacitors in series between their second ends.

20. The system of claim 15, wherein the band tuning circuit further includes:
a first and a second capacitance modules having a first and second predetermined capacitances coupled to the first and second outputs on their first ends,
a first and second resistors coupled in series and further coupled serially between second ends of the first and second capacitance modules with a mid point between the two resistors controlled by the band tuning signal; and
a first and a second switches coupled in series and further coupled serially between second ends of the first and second capacitance modules with a mid point between the two switches coupled to an electrical ground, wherein when the switching signal is applied to gates of the switches, the first and second capacitance modules are coupled in a serial fashion.

21. A voltage controlled oscillator system comprising:
a frequency tuning circuit for receiving a frequency turning signal and a frequency tuning bias signal;
a modulation circuit coupled in a parallel fashion with the frequency tuning circuit;
at least one band tuning circuits coupled with the frequency tuning circuit in a parallel fashion having at least one switching circuit for receiving at least one band tuning signal and at least one switching signal, the band tuning circuit further including:
a first and a second capacitance modules having a first and second predetermined capacitances coupled to the first and second outputs on their first ends,
a first and second resistors coupled in series and further coupled serially between second ends of the first and second capacitance modules with a mid point between the two resistors controlled by the band tuning signal; and
a first and a second switches coupled in series and further coupled serially between second ends of the first and second capacitance modules with a mid point between the two switches coupled to an electrical ground, wherein when the switching signal is applied to gates of the switches, the first and second capacitance modules are coupled in a serial fashion;
a phase-locked loop frequency synthesizer for providing the frequency tuning signal based on at least one of the outputs;
a control circuit coupled with the modulation circuit for providing the modulation signal and the frequency tuning bias signal; and
a core circuit coupled with the frequency tuning circuit, the modulation circuit, and the band tuning circuit for providing a first output and a second output that are complementary to each other,
wherein the core circuit has at least one inductance module for providing a predetermined inductance,
wherein upon asserting the switching signal, the switching circuit is enabled for configuring the band tuning circuit to join the frequency tuning circuit for determining a predetermined output frequency based on a total inductance and a total capacitance provided by the core circuit, the frequency tuning circuit, the modulation circuit and the band tuning circuit upon adjusting the frequency tuning signal, the frequency tuning bias signal, and the band tuning signal, and
wherein all elements of the voltage controlled oscillator system are arranged in a substantially symmetrical fashion.

22. The system of claim 21, wherein the frequency tuning circuit is integrated with the modulation circuit to further include:
a first capacitor and a second capacitor coupled to the first and the second outputs on their first ends respectively;
a first group of varactors having a first varactor and a second varactor coupled in series with and between the first and second capacitors with a mid point between the first and second varactors coupled to the frequency turning signal;
a resistor group having a first resistor and a second resistor coupled in series with and between the first and second capacitors with a mid point between the first and second resistors coupled to the frequency tuning bias signal; and
a second group of varactors having a third varactor and a fourth varactor coupled in series with and between the first and second capacitors with a mid point between the third and fourth varactors coupled to the modulation signal,
wherein the first and second varactor groups and the resistor group are coupled in a parallel fashion and together coupled in series with the first and second capacitors between their second ends.

23. The system of claim 21, wherein the frequency tuning circuit has the modulation circuit separated from a frequency tuning module, which are coupled in a parallel fashion, wherein the frequency tuning module further includes:
a first capacitor and a second capacitor coupled to the first and the second outputs on their first ends respectively;
a first varactor and a second varactor coupled in series with and between the first and second capacitors with a mid point between the first and second varactors coupled to the frequency turning signal; and
a first resistor and a second resistor coupled in series with and between the first and second capacitors with a mid point between the first and second resistors coupled to the frequency tuning bias signal,
wherein the first and second resistors are coupled in a parallel fashion with the first and second varactors and together coupled to the first and second capacitors in series between their second ends;
wherein the modulation circuit further includes:
a first capacitor and a second capacitor coupled in series and to the first and the second outputs on their first ends respectively;
a first varactor and a second varactor coupled in series with and between the first and second capacitors with a mid point between the first and second varactors coupled to the modulation signal; and
a first resistor and a second resistor coupled in series with and between the first and second capacitors with a mid point between the first and second resistors coupled to an electrical ground,
wherein the first and second resistors are coupled in a parallel fashion with the first and second varactors and together coupled to the first and second capacitors in series between their second ends.

24. The system of claim 21 further comprising a core circuit coupled with both the frequency tuning circuit and the band tuning circuit in a parallel fashion for providing an oscillation mechanism, the core circuit having at least one cross-coupled transistor structure for providing a negative resistance and at least one inductance module symmetrically positioned.

* * * * *